United States Patent [19]

Howard

[11] 4,075,653
[45] Feb. 21, 1978

[54] METHOD FOR INJECTING CHARGE IN FIELD EFFECT DEVICES

[75] Inventor: Lowell Francis Howard, Essex Junction, Vt.

[73] Assignee: International Business Machines Corporation, Armonk, N.Y.

[21] Appl. No.: 743,253

[22] Filed: Nov. 19, 1976

[51] Int. Cl.² .................... H01L 29/78; H01L 29/40
[52] U.S. Cl. ........................................ 357/23; 357/53
[58] Field of Search .................................. 357/23, 53

[56] References Cited

U.S. PATENT DOCUMENTS 3,893,151  7/1975  Bosselaar et al. ................. 357/23

Primary Examiner—Edward J. Wojciechowicz
Attorney, Agent, or Firm—Howard J. Walter, Jr.

[57] ABSTRACT

A method is presented for accelerating the injection of minority carriers into an insulating layer overlying a semiconductor substrate under conditions less severe than required to produce impact ionization. The method is useful in characterizing parameters of field effect integrated circuit components subject to various charge instability mechanisms and may also be useful as a means for altering charge conditions in various non-volatile memory devices. A field effect device structure comprising a semiconductor p-n junction adjacent to an insulated gate electrode is utilized in which a depletion region is created under the gate electrode in the presence of alternating forward and reverse biasing of the p-n junction. During the forward bias condition minority carriers are injected into the semiconductor substrate adjacent to the gate electrode structure. During the reverse bias condition previously injected free minority carriers are accelerated by the depletion field produced by the gate electrode such that significant quantities of carriers exceed the semiconductor/insulator barrier potential and are injected into the insulator. The presence of traps in the insulator allows the capture of some of the minority carriers causing a charge to be built up in the insulator which reduces the effective field in the insulator which reduces the effective field in the semiconductor caused by the gate electrode potential. This effect in an MOSFET results in a reduction of threshold voltage. The charge injection technique may be used in combination with majority charge injection techniques, such as drain avalanching, to provide a re-writable non-volatile memory element.

8 Claims, 2 Drawing Figures

METHOD FOR INJECTING CHARGE IN FIELD EFFECT DEVICES

BACKGROUND OF THE INVENTION

1. Field of the Invention

This invention relates to the manufacture and testing of field effect transistors and more particularly to techniques for characterizing instability mechanisms found in certain types of field effect transistors by accelerating the effects of these mechanisms.

2. Description of the Prior Art

Although the metal-insulator-semiconductor field-effect transistor (MISFET) is conceptually the oldest type of active semiconductor device, early attempts to fabricate devices were frustrated because of the presence of high surface state densities at the interface between the semiconductor and the gate insulation. The use of a silicon substrate with thermally produced silicon dioxide as the gate insulator enabled the first successful MISFET to be made as early as 1960. Yet the successful manufacture of MISFETs is still today plagued with instability problems resulting from various charge effects in the insulating or passivating layers essential for field effect operation. Various polarization effects found to alter MISFET operating characteristics are reviewed by Grove and Deal in the *Transactions of the Metallurgical Society of AIME*, Volume 242, March 1968, pages 512–523.

Various specific mechanisms have been previously observed which enable charged carriers to be injected into MIS insulating layers. Nicollian et al. reported in *Applied Physics Letters*, Vol. 15, No. 6, Sept. 15, 1969, pages 174–177, that high AC fields applied to MOS capacitors could cause avalanche injection of hot minority carriers into silicon dioxide from a silicon substrate. In order to establish a high enough field within the substrate to cause impact ionization, or avalanching, it was necessary to use a sinusoidal electric field to prevent the formation of an inversion layer which would tend to reduce the effective field required for avalanching. Such unusual stress conditions are not found in the normal operation of MISFETs and direct surface avalanching is not a recognized instability problem in devices used in actual circuits today. Another instability phenomenon is that of majority carrier injection caused by avalanching the drain to substrate junction of an MOSFET. Hara et al reported in the *Japanese Journal of Applied Physics*, Vol. 9, No. 9, September 1970, pages 1103–1112, that if the reverse bias voltage on the drain is increased beyond a critical breakdown value, in the presence of a low gate voltage, avalanching occured causing injection of majority carriers, holes for p-type substrates, from the silicon substrate to the gate dielectric. Since voltages as high as the required p-n junction avalanche breakdown voltage are rarely seen in actual circuits, drain avalanche caused injection is not a significant instability problem. Erb et al described a "stacked gate tetrode" in the *IEEE Transactions on Electron Devices*, Vol. ED-18, No. 2, February 1971, pages 105–109. This multiple gate structure was capable of injecting hot minority carriers into a gate dielectric. Fields required were about 3 times lower than required for p-n junction avalanche and 4 times lower than required for straight surface avalanche of MOS capacitors. The stacked gate electrode device is not found in conventional circuits and any instability caused by injection of carriers under such conditions is not a problem in practical devices.

In 1973, Verway reported in the *Journal of Applied Physics*, Vol. 44, No. 6, June 1973, pages 2681–2687, that hot minority carriers could be injected under non-avalanche conditions provided that a sufficiently high reverse bias (less than the avalanche breakdown voltage) was applied to the source and drain in the presence of (1) a sufficiently high gate voltage and (2) a continuously forward biased p-n junction located below the channel region. The forward biased p-n junction was used to provide carriers in the presence of a fixed field across the dielectric which created a steady state depletion region. Various non-volatile memory device structures based on the non-avalanche injection phenomenon are found in U.S. Pat. No. 3,893,151 to Bosselaar et al., including the use of light to provide a sufficient number of minority carriers. The use of drain avalanche in an MOSFET to provide charge cancelling injection of majority carriers is also described. Ning and Yu studied the trapping efficiency of the dielectric, the capture cross sections, and concentrations of electron traps in silicon dioxide layers by using optically induced hot-electron injection, *Journal of Applied Physics*, Vol. 45, No. 12, December 1975, pages 5373–5378. Since production quantities of MOSFET devices are not fabricated with an underlying p-n junction and are not utilized in an optically active environment, such abnormal conditions prove to be of little economic value in a manufacturing environment.

Abbas and Dockerty reported in *Applied Physics Letters*, Vol. 27, No. 3., Aug. 1, 1975, pages 147–148, that sub-avalanche injection of minority carriers may take place in small MOSFET devices operated in the normal range of operation. They also indicated that nitride passivated MOSFETs were particularly susceptible to threshold drift because of the large quantity of traps present at the nitride/oxide interface of the dual dielectric structure. They reported at the 1975 International Electron Devices Meeting, Dec. 1–3, 1975 that the earlier reported phenomenon was particularly sensitive to applied gate-to-drain voltage and channel length and that carriers were found to be injected only at the drain end of the channel, as in the drain avalanche condition, see Technical Digest 1975 IEDM, paper 3.2, pages 35–38 (1975). Instabilities in conventional MOSFETs due to the hot electron injection observed by Abbas and Dockerty may be controlled by increasing substrate resistivity and insuring that maximum source-to-drain and gate-to-drain voltage conditions are not exceeded during device operation.

Ning, Osburn and Yu reported in *Applied Physics Letters*, Vol. 29, No. 3, Aug. 1, 1976, pages 198–200, that yet another instability mechanism was found to cause variations in MOSFET device thresholds even when the conditions observed by Abbas and Dockerty were not exceeded. Ning et al found that minority carriers could be injected into the dielectric of n-channel MOSFETs by applying a negative bias to the substrate and a positive bias to the gate, with the source and drain junctions grounded. Thermally generated leakage current was found to provide sufficient free minority carriers which in the presence of a gate induced depletion layer of a MOSFET provides favorable conditions for non-avalanche injection of carriers into the gate dielectric. Although normal leakage induced alteration of device parameters is an extremely slow process, changes may occur over a period of thousands of hours which can effect device reliability over the expected life time of the device, particularly at elevated temperatures. Ning et al. reported FET threshold shifts on the order of a few hundred millivolts over a few hours under conditions intended to enhance the minority carrier injection. These conditions included low resitivity semiconductor substrate and elevated temperatures, i.e. higher leakage rate. Conventional silicon nitride passivated FETs have been shown to potentially exhibit threshold voltage changes of over 3 volts when operated over many tens of thousands of hours. In order to evaluate the reliability effects of leakage induced threshold shift as a function of device processing parameters and device design characteristics, extended static stress tests similar to those of Ning et al have been used which take many thousands of hours to obtain useful results.

In summary, various distinctly different instability phenomena have been observed which alter the operating characteristics of MOS devices. Most of these have either been found not to occur in normal operating environments or are known to be avoidable by proper device design or by the use of controlled operating conditions. Thermally generated leakage current has recently been found to be the source of an inherent carrier injection phenomenon which, although the effect is to some extent reducible, is not avoidable. Device reliability effects of leakage induced threshold shift are presently determinable only over an extremely extended period of time. While minority carrier generating mechanisms such as light and/or burried p-n junctions have been used to artificially create sufficient free carriers to observe threshold shifts, these techniques have the disadvantage of not being compatable with current manufacturing techniques used in MOSFET production.

Additional prior art which may be considered to be pertinent to the injection of minority carriers in semiconductor devices include U.S. Pat. No. 3,569,799 of Fang et al., assigned to the assignee of the instant invention, which relates to the forward and reverse biasing of a p-n junction in the vicinity of a negative resistance exhibiting dielectric in which avalanche breakdown conditions are used to alter the conductivity of the dielectric and U.S. Pat. No. 3,858,232 of Boyle et al. which teaches the use of a forward biased p-n junction as a source of minority carriers in a charge coupled shift register.

SUMMARY OF THE INVENTION

The instant invention comprises a method for accelerating the effects of leakage induced threshold shift observable in MOSFET devices under certain operating conditions. The method is particularly adaptable to conventional MOSFET processing and requires neither special test site implementation nor a special test oriented environment. Briefly, the technique comprises applying to an MOS device a static gate-to-substrate field tending to produce inversion in the semiconductor substrate but of magnitude less than required to cause either surface avalanche in the semiconductor or dielectric breakdown avalanche in the insulator and thereafter applying alternating forward and reverse bias potentials to a region of oppositely doped semiconductor material adjacent to the gate electrode to alternately cause the injection of free minority carriers into the substrate under the gate electrode and the injection of minority carriers from the substrate into the insulator. The magnitude of the reverse bias potential applied to the region of oppositely doped semiconductor is less than required to cause avalanching of the p-n junction between the region and the substrate. The frequency of the applied polarity reversals is sufficiently high so as to ensure that a sufficient quantity of free minority carriers are available within the substrate under the gate electrode to cause large quantities of carriers to be injected during the reverse biased condition of the region.

Accordingly, it is an object of the invention to provide a method for accelerating the injection of free carriers from a semiconductor substrate into a dielectric layer of an MOS device suitable for implementation in a MOSFET manufacturing process as a process monitor.

It is another object of the invention to provide a method of simplifying the study of reliability detracting mechanisms in MOSFET devices.

The foregoing and other objects, features, and advantages of the invention will be apparent from the following more particular description of the preferred embodiment of the invention, as illustrated in the accompanying drawings.

SUMMARY OF THE INVENTION

As indicated above, leakage induced MISFET threshold shift is the result of the injection of minority carriers, with respect to a semiconductor substrate, generated as free carriers as a result of normal thermal generation present in semiconductor materials. Although the presence of gate current through the MISFET gate dielectric is not harmful in itself, the presence of traps in the dielectric causes some of the injected carriers, electrons for a p-type semiconductor substrate, to be retained in the dielectric thereby decreasing the effective gate applied field at the semiconductor substrate. The trapped carriers cause an increase in required gate voltage for a specified conduction level between the source and drain of the device. Although silicon dioxide films can be fabricated having few traps, and thus being relatively unsensitive to leakage induced threshold shift, it is preferable for additional design considerations to utilize dual dielectric layers for gate dielectrics, such as phosphosilicate glass (PSG)/silicon dioxide or silicon nitride/silicon dioxide (MNOS) layers. Such dual layer structures have the disadvantage of providing a large number of trapping sites in the vicinity of the oxide/nitride interface. See the article "Charge Storage Model for Variable Threshold FET Memory Element," F. A. Sewell et al., *Applied Physics Letters*, Jan. 15, 1969, pp. 45–47, for a general description of this type of MIS structure. By proper design MNOS FETs may be designed in which fixed threshold characteristics are exhibited under most operating conditions. An example of such a MNOS device for use in a dynamic memory circuit can be found in U.S. Pat. No. 3,811,076 to W. M. Smith, assigned to the assignee of the instant invention. Although leakage induced threshold shift occurs in both MOS and MNOS devices, it is more of a reliability concern in the dual dielectric MNOS structure.

Figure 1:
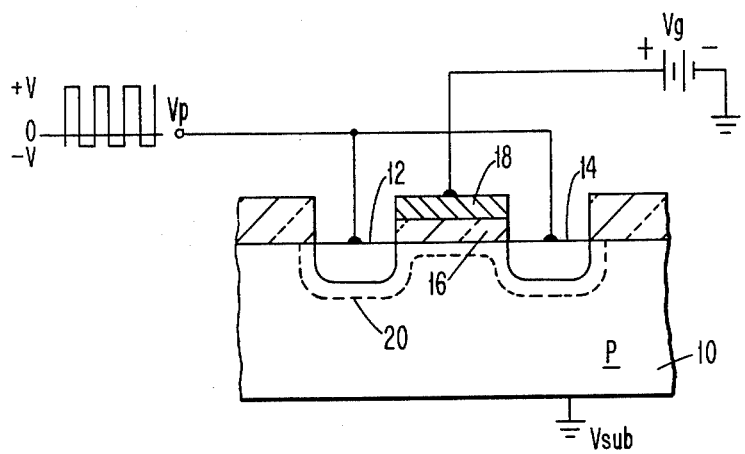
FIG. 1 is a schematic sectional view of a MOSFET device showing the operating conditions necessary to produce accelerated injection of hot carriers from a semiconductor substrate into an overlying dielectric layer.

Referring now to FIG. 1 there is shown a schematic cross-section of a typical MISFET which is for purposes of illustration an n-channel device. The FET comprises a p-type silicon substrate 10 having n-type source and drain regions 12 and 14, respectively. Those skilled in the art will recognize that in a symetrical device, as shown, the source and drain regions are interchangeable but that the physical size and designation of regions 12 and 14 may also be varied to suit different device design requirements. Intermediate regions 12 and 14 on the surface of substrate 10 is a relatively thin, 300 to 1000 Angstrom units, dielectric layer 16 which may be a single or multiple layer. The preferred embodiment of layer 16 is silicon nitride over silicon dioxide. Overlying dielectric layer 16 is a conductive gate electrode 18 which may be aluminum, polycrystalline silicon, molybdenum, or other conductive material.

Leakage induced threshold shift occurs in MOSFETs in circuit environments in which a gate-to-substrate potential Vg, which tends to cause the formation of a depletion region in the substrate, is applied between gate electrode 18 and substrate 10 under conditions in which both the source 12 and drain 14 are at approximately the same potential. This last condition is achieved in the testing environment by physically connecting the source and drain to a common terminal as illustrated in FIG. 1. Under these conditions a depletion region 20 is formed by the reverse biased source and drain regions and by the influence of the gate potential Vg on the substrate. A thin conduction channel will also be formed at the interface between substrate 10 and dielectric layer 16. Thermal generation of free carriers within or near the depletion region will subject these free carriers to the field created by depletion region 20. Minority carriers (electrons in a p-type substrate) will be attracted toward the dielectric/substrate interface.

Figure 2:
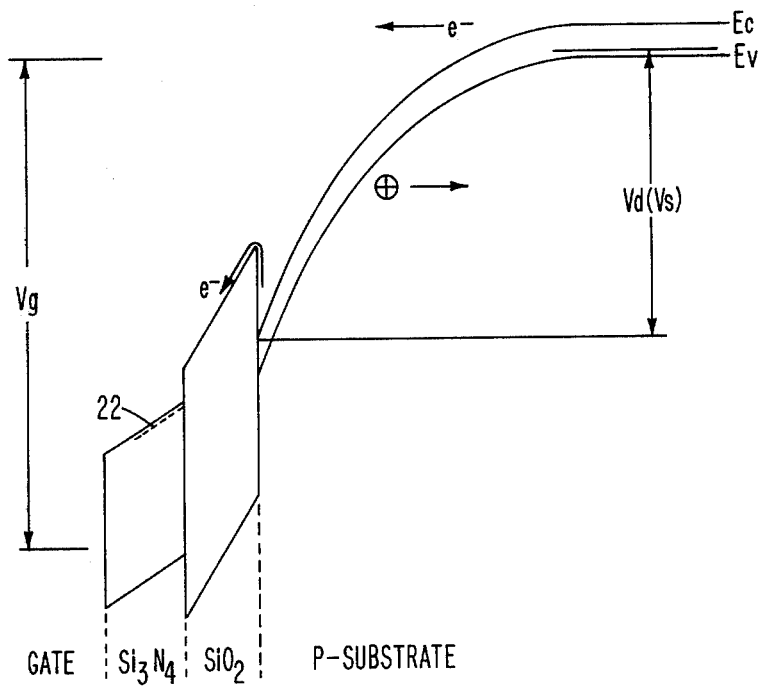
FIG. 2 is an energy band diagram of a section of the channel region of the MOSFET of FIG. 1 showing the conditions under which minority carriers are injected.

Referring now to FIG. 2 there is shown the energy band diagram of a section of the channel region under gate electrode 18 between source 12 and drain 14. The conduction and valence bands in the p-type substrate are curved under the influence of the gate-to-substrate potential creating an accelerating field gradient for electrons toward the substrate/dielectric ($SiO_2$) interface. Under conditions of sufficiently high band bending, free electrons in the substrate may gain sufficient potential to exceed the substrate/dielectric interface barrier potential and thus be injected into the dielectric. It should be noted that under device operating conditions, for example, in a grounded source device, in which current (consisting of minority carriers) is flowing between the source and drain regions a large portion of the channel region is clamped to ground potential preventing a sufficiently large field from occurring in the substrate.

The injected electrons pass through the relatively trap-free silicon dioxide layer but a large portion are retained in traps near the silicon dioxide/silicon nitride interface, as indicated by the short dashed lines 22 in FIG. 2. The previously cited Ning et al references may be referred to for a more specific discussion of leakage induced threshold shift. Specific MOSFET devices biased under actual operating conditions have been projected to exhibit threshold shifts on the order of 3 to 4 volts over an extrapolated period of several thousand hours. Based on data obtained over a period of up to one thousand hours the threshold shift appears to saturate, apparently due to saturation of available traps in the dielectric.

The method utilized to accelerate the injection of hot carriers will be described in connection with FIG. 1. A MNOSFET, as previously described has its substrate connected to a substrate potential Vsub equal to ground. A gate potential Vg of about 16 volts positive is applied to gate electrode 18 to create a depletion region in semiconductor substrate 10. Vg is chosen to be greater than the threshold voltage of the FET but significantly less than required to produce either surface avalanche injection or dielectric breakdown avalanche. The source and drain regions of the device are commonly connected to a pulse generator, not shown, which provides bipolar pulses Vp. The pulses Vp are essentially a square wave having a positive amplitude of about 10 volts positive and a negative amplitude of about 1.0 volts negative, both with respect to the substrate potential, at a frequency of about 1.0 magahertz. During the positive portion of Vp the MNOSFET is biased such that leakage induced threshold shift conditions are introduced. FIGS. 1 and 2 show the device under this condition. Since the gate potential Vg exceeds the threshold voltage of the device and both source and drain regions are reversed biased, a depletion region 20 extends from the source/substrate junction through the channel region to the drain/substrate junction. During the negative portion of the cycle, both the source and drain regions are forward biased to a small extent causing minority carriers (electrons) to flood the substrate regions surrounding source and drain regions 12 and 14. When the polarity of Vp again reverses, a large quantity of free carriers will be influenced by the again established depletion layer and be accelerated toward the substrate/silicon dioxide interface and subsequently injected across the interface. It has been found that in less than 20 seconds threshold shifts have exhibited saturation, a condition not yet actually observed in an actual circuit environment. The saturation voltages observed correlate very closely with voltages calculated to be achievable under normal operating conditions. Thus a test having a duration of only a few seconds provides the same information as one taking over thousands of hours. Implementation of the test requires no special equipment other than a pulse generator and can be applied to a conventional device structure without resort to a burried constantly forward biased injection junction as described in the prior art. The need for a special light responsive structure such as transparent electrodes or equipment designed to illuminate the back side of the substrate are also eliminated.

Applications of the test may be found in process monitoring and control, evaluation of new process technology and/or structures, screening of low reliability devices and evaluating threshold stabilization techniques.

Although other techniques such as the use of elevated temperatures and voltages, the use of optically produced carriers, the use of junction or dielectric avalanching or the use of electron beams, could possibly be used to cause threshold voltage changes; these techniques have one or more of the following disadvantages. They may not be fast enough to provide timely results; they may introduce new or different hot carrier injection mechanisms; they may cause detrapping or removal of already trapped carriers; or they may cause physical damage to the device under test which alters the observable effects of leakage induced threshold shift.

The subject method is free of these undesirable characteristics and also has the advantage of simple implementation. Devices undergoing pulse induced threshold shift have the same physical characteristics as devices experiencing leakage induced threshold shift.

Another important advantage of the subject test method is that it may be applied at various stages of device processing.

Although the invention has been described with respect to an n-channel MNOSFET, it will be clear to those skilled in the art that the same phenomenon will occur in p-channel devices as well as devices having single gate dielectric layers, although the observable effects may be of smaller magnitude.

While the invention has been described with respect to a specific embodiment disclosed herein, it will be understood that this is merely illustrative of the many forms which the invention may take in practice and that numerous additional modifications thereof will readily occur to those skilled in the art without departing from the scope of the invention.

What is claimed is:

1. The method of accelerating the injection of hot minority carriers from a semiconductor substrate into an overlying dielectric layer in an insulated gate field effect device comprising the steps of:

providing an insulated gate field effect device having a semiconductor substrate including at least one p-n junction bounded surface region, and a conductive gate electrode overlying a dielectric layer contacting said substrate adjacent to said p-n junction bounded region;

providing a gate-to-substrate bias potential to said device, said bias potential being insufficient to cause a surface avalanche condition to exist in said substrate; and applying alternating forward and reverse bias potentials between said p-n junction bounded region and said substrate to alternately cause injection of minority carriers into said substrate under said gate electrode and injection of at least some of said free carriers into said dielectric layer, said reverse bias potential being insufficient to cause avalanche breakdown between said p-n bounded region and said substrate.

2. The method of claim 1 wherein said insulated gate field effect device comprises a second p-n junction bounded region connected in electrical common to said first p-n junction bounded region, said device thereby defining a transistor.

3. The method of claim 1 wherein the step of applying alternating forward and reverse bias potentials is effected by a bipolar signal having a reverse bias potential of significantly larger magnitude than said forward bias potential.

4. The method of claim 1 wherein said dielectric layer comprises at least two different dielectric materials.

5. The method of claim 4 wherein said dielectric layer comprises silicon dioxide and silicon nitride.

6. The method of claim 1 wherein said alternating forward and reverse bias potentials are applied in the form of pulses of about 1 microsecond duration.

7. A test structure for evaluating the effects of leakage induced threshold shift comprising:

an insulated gate field effect transistor having source and drain electrodes, a gate electrode for controlling a channel region, and a substrate;

means for applying a fixed potential between said gate electrode and said substrate, said fixed potential being of a magnitude and polarity to cause the formation of a depletion region in said channel region; and means for coupling both of said source and drain electrodes to a source of bipolarity pulses for biasing said source and drain electrodes in alternating forward and reverse bias conditions with respect to the potential of said substrate;

whereby minority carriers injected into the substrate of said transistor during said forward bias condition are injected into the insulated gate of said transistor during said reverse bias condition.

8. The test structure of claim 7 wherein the insulated gate transistor is a metal-silicon nitride-silicon dioxide-semiconductor transistor.

* * * * *